United States Patent [19]
Ackerman

[11] Patent Number: 6,064,681
[45] Date of Patent: May 16, 2000

[54] WAVELENGTH STABILIZED, TUNABLE OPTICAL TRANSMITTER WITH HIGH SMSR

[75] Inventor: David Alan Ackerman, Hopewell, N.J.

[73] Assignee: Lucent Technologies Inc., Murray Hill, N.J.

[21] Appl. No.: 09/330,389

[22] Filed: Jun. 11, 1999

[51] Int. Cl.[7] .......................................................... H01S 3/13
[52] U.S. Cl. ................................ 372/32; 372/20; 372/29; 372/38; 372/96
[58] Field of Search ................................ 372/32, 20, 96, 372/22, 38

[56] References Cited

U.S. PATENT DOCUMENTS 5,220,578  6/1993  Koch et al. .............................. 372/96

OTHER PUBLICATIONS

S. L. Woodward et al., *A Control Loop . . .* , IEEE Photonics Tech. Lett., vol. 4, No. 5, pp. 417–419 (May 1992).

*Primary Examiner*—Leon Scott, Jr.
*Attorney, Agent, or Firm*—Eugen E. Pacher

[57] ABSTRACT

In practical WDM systems, the maximum SMSR for each channel does not necessarily occur where $dP_{out}/dI_{tune}=0$. In fact, for most channels the maximum SMSR occurs at values of tuning current where this first derivative in not zero. In accordance with one aspect of the invention, a wavelength stabilized optical transmitter includes a DBR laser and a feedback loop for controlling the center wavelength of the laser, characterized in that the transmitter also includes a memory in which are stored the non-zero values of $dP_{out}/dI_{tune}$ where the SMSR is a maximum for each of a multiplicity of different channel wavelengths and further includes a controller responsive to the stored values for delivering to the laser a level of tuning current that maximizes the SMSR for a particular channel wavelength.

9 Claims, 5 Drawing Sheets

WAVELENGTH STABILIZED, TUNABLE OPTICAL TRANSMITTER WITH HIGH SMSR

FIELD OF THE INVENTION

This invention relates generally to tunable optical transmitters, and, more particularly to such transmitters that include tunable DBR semiconductor lasers and arrangements for stabilizing such lasers and for maintaining their side mode suppression ratio (SMSR) relatively high

BACKGROUND OF THE INVENTION

Wavelength division multiplexed (WDM) optical networks increase the information carrying capacity of a communication (e.g., transmission) system by loading multiple channels, each at a different carrier frequency or wavelength, onto a single optical fiber. Over the last few years, the channel density of commercial WDM systems has increased dramatically. At the present time, for example, commercially available systems are available that operate at carrier wavelengths around 1.55 μm and that carry 80 individual channels spaced at 50 GHz. Even larger capacity systems are being planned. These systems are often referred to as dense WDM or DWDM systems. It is advantageous in such systems to use optical sources (or transmitters) that can operate at any one of a subset of the desired channel wavelengths.

However, as these systems are operated for long periods of time, the DBR semiconductor lasers tend to degrade in performance due to aging and material defects. As a result, the wavelength of the laser drifts from the desired channel wavelength. If the drift is sufficiently large, the laser may experience a mode hop; ie., its output may switch abruptly to a different longitudinal mode. In a WDM system, a channel experiencing a mode hop would abruptly start to operate in a mode (i.e., at a carrier wavelength) different from that originally assigned (e.g., at a channel wavelength different from that designated by an ITU grid).

Concomitant with the need to control (i.e., stabilize) the lasers so that each channel operates at a predetermined carrier wavelength (longitudinal mode) without mode hopping is the need to maintain the intensity of other longitudinal modes relatively low, that is, the side mode suppression ratio should be maintained as high as possible.

One prior art approach to achieving wavelength stabilization and maintaining high SMSR is described by S. L. Woodward et al, *IEEE Photonics Lett.*, VoL 4, No. 5, pp. 417–419 (May 1992), which is incorporated herein by reference (hereinafter referred to as Woodward). In the Woodward arrangement a DBR laser includes a Bragg tuning section monolithically integrated with and disposed between a gain section and a photodetector section. A control loop ostensibly ensures single mode operation of the laser with high SMSR More specifically, a 100 kHz sine wave (dither) is added to the tuning current applied to the Bragg section An error signal is derived from light transmitted through the Bragg section to the integrated photodetector. This error signal is detected in a lock-in amplifier and fed back to the tuning section. As shown in FIG. 2 of their paper, Woodward suggests that maximum SMSR is obtained when the first derivative of the detector current (i.e., the laser output power) with respect to the tuning current is zero (i.e., $dP_{out}/dI_{tune}=0$).

SUMMARY OF TIRE INVENTION

In practical WDM systems, I have found that the maximum SMSR for each channel does not necessarily occur where $dP_{out}/dI_{tune}=0$. In fact, in a representative case the SMSR at $dP_{out}/dI_{tune}=0$ may be 3–5 dB below the maximum; i.e., for most channels the maximum SMSR occurs at values of tuning current where this first derivative is not zero. Taking advantage of this discovery, in accordance with one aspect of the invention, a wavelength stabilized optical transmitter includes a DBR semiconductor laser and a feedback loop for controlling the center wavelength of the laser, characterized in that the transmitter also includes a memory in which are stored the non-zero values of $dP_{out}/dI_{tune}$ where the SMSR is a maximum for each of a multiplicity of different channel wavelengths and further includes a controller responsive to the stored values for delivering to the laser a level of tuning current that maximizes the SMSR for a particular channel wavelength. dr

BRIEF DESCRIPTION OF THE DRAWING

The invention, together with its various features and advantages, can be readily understood from the following more detailed description taken in conjunction with the accompanying drawing, in which.

Figure 1:
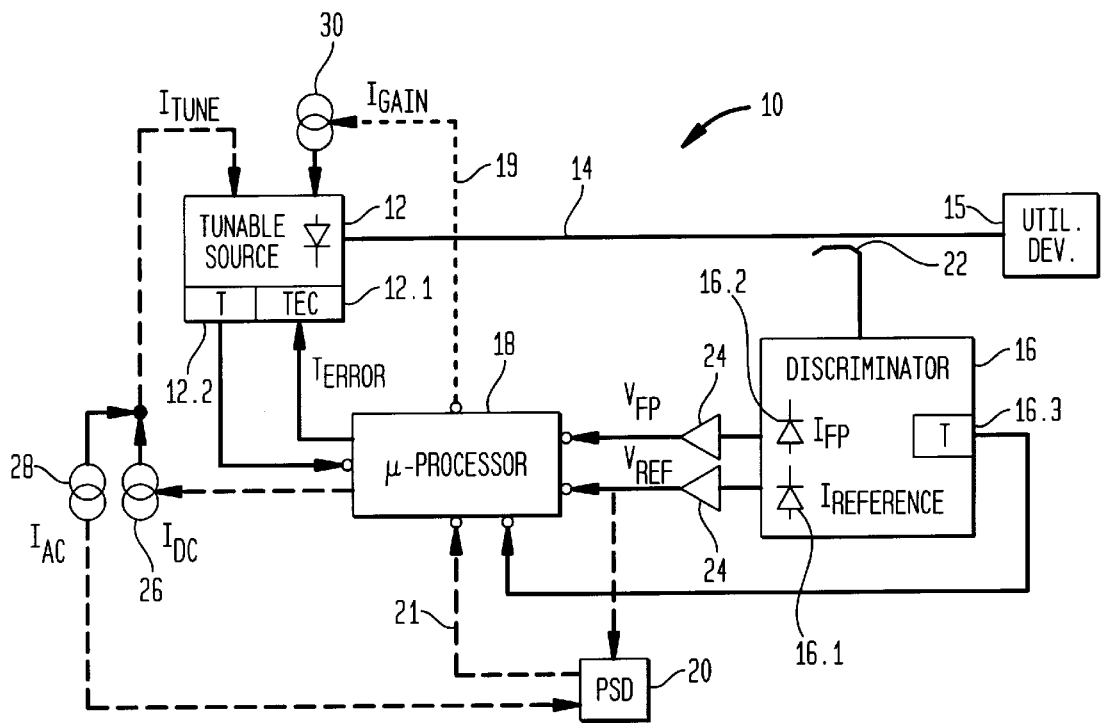
FIG. 1 is a schematic, block diagrammatic view of an optical transmitter in accordance with one embodiment of the invention in which an analog scheme is used to generate $dP_{out}/dI_{tune}$.
Figure 2:
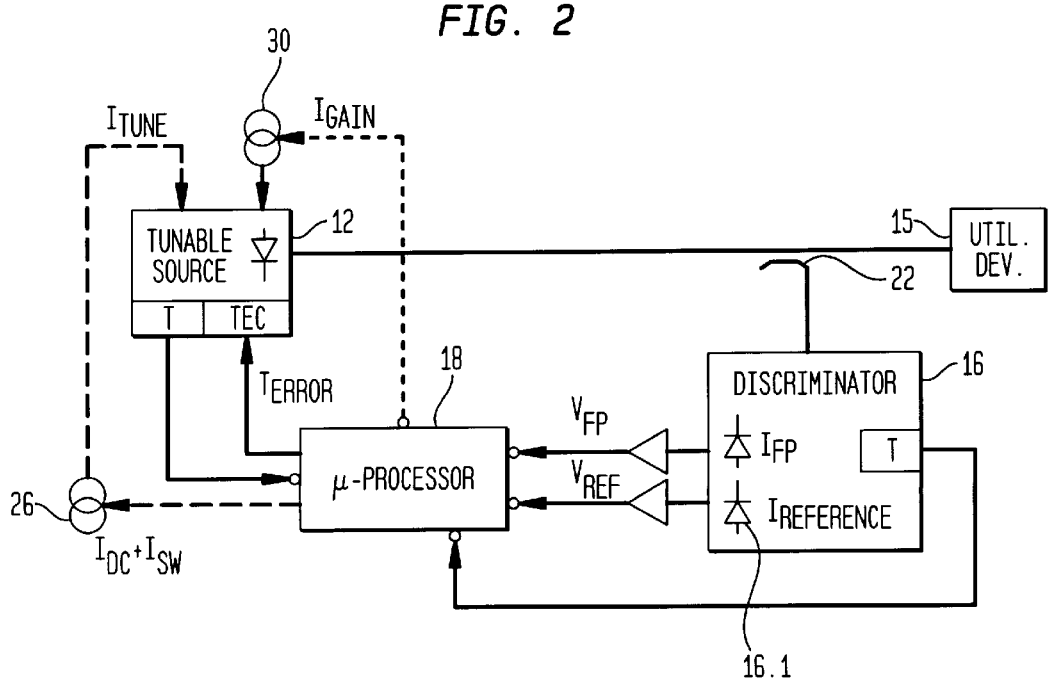
FIG. 2 is a schematic, block diagrammatic view of an optical transmitter in accordance with another embodiment of the invention in which a digital scheme is use to generate $dP_{out}/dI_{tune}$.

In the interest of clarity and simplicity, FIGS. 1 & 2 have not been drawn to scale. In addition, when describing physical or optical dimensions, the symbol A stands for Angstroms, whereas when describing electric current, it stands for Amperes.

DETAILED DESCRIPTION OF THE INVENTION

With reference now to FIG. 1, an optical transmitter 10 in accordance with one embodiment of the invention comprises a tunable, distributed Bragg reflector (DBR) laser 12 designed to generate a light output at any one of a multiplicity of center wavelengths; for example, the carrier or channel wavelengths of a WDM communication system. The laser output is coupled to a transmission medium, illustratively depicted as an optical fiber 14. In a WDM system the outputs of a plurality of DBR lasers would be combined, for example in a suitable passive coupler (not shown), for simultaneous transmission over the fiber. The latter delivers the laser output to a utilization device 15 that may include a piece of terminal equipment, a optical receiver, an optical amplifier, an optical isolator, an optical coupler, an optical multiplexer, etc.

The DBR laser, which is well known in the art, typically comprises at least two monolithic, optically coupled sections arranged in tandem: a gain section and a DBR section.

Optionally, the laser may also include one or more of the following devices monolithically integrated therewith: an optical amplifier section, a modulator section, a photodetector section, other grating sections, or frequency tuning sections. Alternatively, the photodetector may be a discrete device external to the laser. (As discussed later, each of the embodiments of FIGS. 1 & 2 utilizes an external discrete photodetector 16.1 that is part of frequency discriminator 16.) In either case, the photodetector serves as a monitor of the output power of the laser. The output power is, in turn, determined by the gain current $I_{gain}$ applied to the gain section. The output emission may emerge from the gain section, in which case it is commonly referred to as front facet emission, or it may emerge from the DBR section (or integrated photodetector section, if used), in which case it is commonly referred to as back facet emission On the other hand, a tuning current $I_{tune}$ is applied to the DBR section in order in order to tune the center wavelength of the laser output. In a WDM system the laser would be capable of generating any one of a multiplicity of center wavelengths corresponding to a subgroup of the channel wavelengths. The outputs of different lasers generating different subgroups of wavelengths would then be combined to cover the spectrum spanned by the channels of the system.

Without more, however, the output wavelength of the laser 12 would not be stable over long periods of time; that is, the wavelength tends to drift due to aging and material defects in the laser. As discussed earlier, if the wavelength drift is sufficiently large, the laser may exhibit mode hopping; i.e., it may abruptly switch from operation in one longitudinal mode (center wavelength) corresponding to the desired or assigned channel wavelength to another longitudinal mode. Consequently, the transmitter 10 is provided with several feedback loops to stabilize its output wavelength and to suppress mode hopping. Optionally, it may also include a third feedback loop to maintain its output power constant.

More specifically, transmitter 10 includes a wavelength-stabilization feedback loop formed by an optical coupler or tap 22, a frequency discriminator 16, a microprocessor ($\mu$P) 18 and laser 12. Well known thermoelectric cooler (TEC) 12.1 and temperature sensor 12.2 are thermally coupled to the laser. The tap 22 couples a small portion (e.g., 5%) of the light output to the discriminator 16. The discriminator, also well known, includes a collimator (not shown) for directing the optical signal from tap 22 to a beam splitter (also not shown). The latter splits the beam into two portions one of which is received by a reference photodetector 16.1 and the other of which is passed through a Fabry-Perot (FP) etalon (not shown) to a FP photodetector 16.2. The DC photocurrents $I_{FP}$ and $I_{ref}$ from these photodetectors are coupled to transimpedance amplifiers 24 to generate corresponding voltage signals $V_{FP}$ and $V_{ref}$ that are supplied as inputs to $\mu$P 18. Discriminator 16 also includes a temperature sensor 16.3 that supplies another input to $\mu$P 18, as does the temperature sensor 12.2 of laser 12. The $\mu$P in turn supplies an error signal $T_{error}$ to TEC 12.1 to controllably alter the temperature of the laser and, more particularly the temperature of the DBR section of the laser.

In operation, the wavelength-stabilization feedback loop measures the ratio (referred to as the discriminant) of the DC photocurrents. The error signal $T_{error}$ is generated by deviation of this discriminant from the value stored in the $\mu$P for a predetermined center wavelength of operation for the laser (e.g., an ITU grid point). The error signal drives the TEC 12.1 to alter the temperature of the laser in a closed loop feedback fashion to null the deviation.

On the other hand, the mode-hop-suppression feedback loop includes a phase sensitive detector (PSD) 20 (e.g., a lock-in amplifier), a DC source 26 of tuning current, an AC source 28 of dither signal, and $\mu$P 18. PSD 18 receives inputs from the $V_{ref}$ output of discrmintor 16 and from a dither source 28 and delivers its output signal (e.g., the in-phase signal of the lock-in amplifier) over connection 21 to $\mu$P 18. The dither signal from source 28 is added to the DC tuning signal from source 26 and is applied to the DBR section of the laser. The magnitude of the DC tuning current is controlled by $\mu$P 18.

Illustratively, the DC tuning current ranges between 0.1 and 40 mA, whereas the dither current may have a relatively small amplitude of only about 10 $\mu$A peak-to-peak.

In operation, the combination of the PSD 20 and the dither source 28 constitutes an analog approach to generating the first derivative of the output power of the laser with respect to the tuning current; i.e., $dP_{out}/dI_{tune}$. (As discussed later with reference to FIG. 2, a digital approach to generating this derivative may also be utilized.) Where the PSD is a lock-in amplifier, the in-phase lock-in signal generated by the amplifier is proportional to this first derivative. The in-phase signal is taken to be positive when the derivative is positive, and otherwise it is taken to be negative or zero. (The quadrature signal from the lock-in amplifier has been observed to be insignificant for all values of tuning current used) This first derivative is used control the operation of the laser so that it operates at maximum SMSR for whatever channel it is designated to provide the carrier signal. By maximum we mean to include not only the local maximum for each channel but also values for SMSR that are within about 1 dB of that maximum. This range of acceptable SMSRs, of course, means that there is a corresponding range of acceptable values of $dP_{out}/dI_{tune}$ and/or tuning current.

Figure 3:
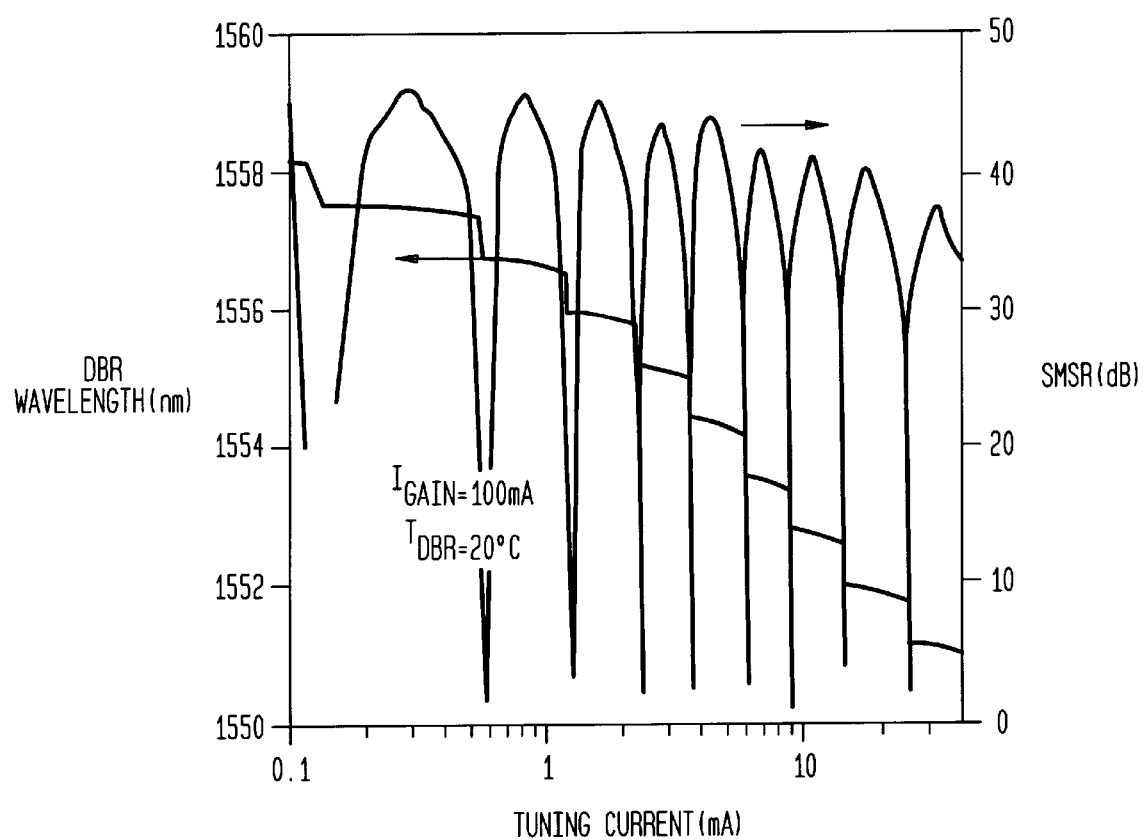
FIG. 3 shows graphs of the wavelength of the output of a DBR laser and its SMSR as a function of tuning current measured at a gain current of 100 mA and a temperature of 20° C.
Figure 4:
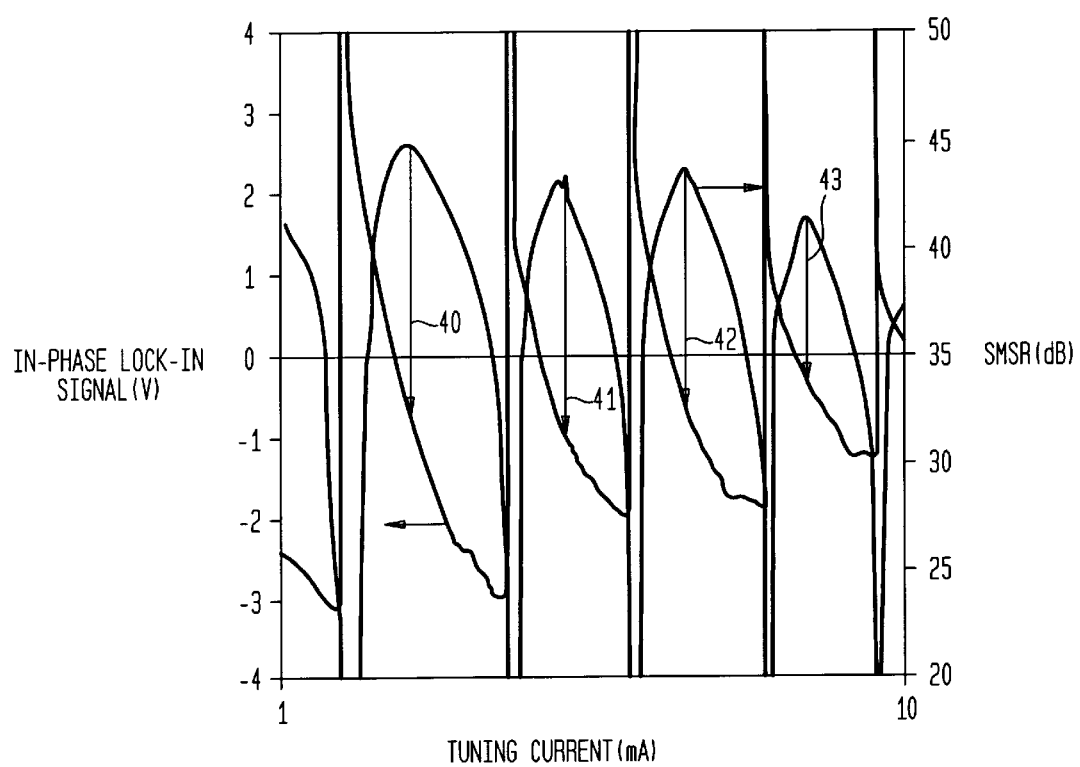
FIG. 4. shows graphs of the in-phase lock-in signal and the SMSR as a function of tuning current.

Thus, the staircase graph of FIG. 3 depicts the tuning of a DBR laser with each approximately horizontal step containing different values of the in-phase lock-in signal (ie., values proportional to $dP_{out}/dI_{tune}$) corresponding to the local maximum SMSR Typically these values are stored in memory in the $\mu$P 18 before the transmitter is deployed in the field, e.g. while it is still in the factory. FIG. 4 illustrates the situation The four vertical arrows 40–43 designate the values of the in-phase lock-in signal that provide a local maximum SMSR for each of four adjacent channels. In this case, the values −0.9, −1.0, −0.8, and −0.4 would be stored for channels corresponding to arrows 40–43, respectively. The corresponding values of tuning current may also be stored in memory. Following the definition of the term maximum above, a range of these values might be stored to cover each of the local maxima ±1 dB.

Figure 5:
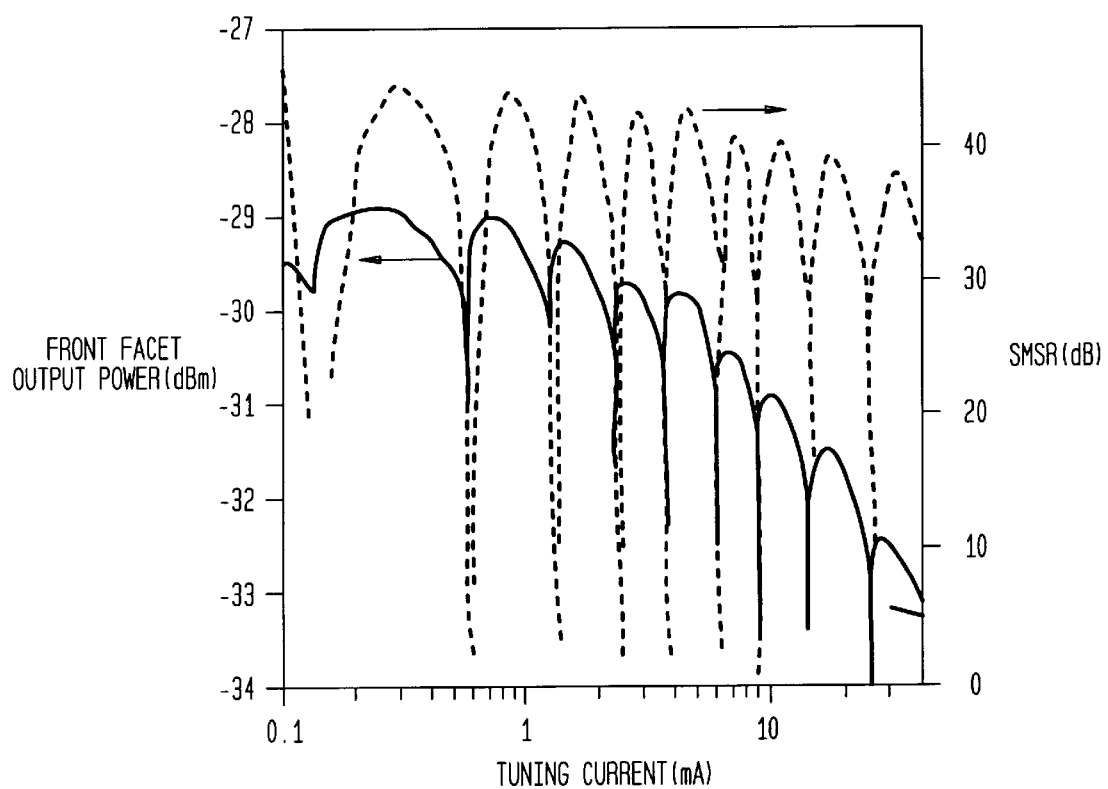
FIG. 5 shows graphs of the front facet output power (solid lines) and the SMSR (dashed lines) to demonstrate that the maximum SMSR for each channel does not necessarily occur at tuning currents where $dP_{out}/dI_{tune}$ is zero.

It is important to note that the values of tuning current corresponding to local maximum in SMSR do not necessarily correspond to those where $dP_{out}/dI_{tune}=0$, as illustrated in FIG. 5. Here, the graphs depict both the front facet output power of the DBR laser and the SMSR as a function of tuning current. The peaks of the power curve, where $dP_{out}/dI_{tune}=0$, clearly do not align with the peaks of the SMSR curve, the local maxima in SMSR. In fact the tuning currents where $dP_{out}/dI_{tune}=0$ appear to be skewed toward the lower current side of each SMSR peak and tend to be at values where the SMSR is 3–5 dB below the local maxima Use of a constant amplitude dither current gives reduced lock-in signal for higher values, of tuning current. In practice, enough lock-in signal is detected to stabilize the tuning current to a particular value corresponding to an SMSR within about 1 dB of the local maximum for each tuning step (i.e., each channel). If more signal were required, the amplitude of the dither current could be scaled proportional to the tuning current to give constant optical modulation depth for each channel at each point of maximum SMSR. Alternatively, a constant voltage amplitude dither signal could be used.

The optional power control loop, shown in FIG. 1, includes the $\mu$P 18, the connection 19 to gain current source 30, and the laser 12.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the first derivative $dP_{out}/dI_{tune}$ may be generated digitally rather than in the analog fashion described above. FIG. 2 illustrates this embodiment of the invention. The $\mu$P 18 generates a square wave current $I_{SW}$ and controls its amplitude and duration. $I_{SW}$ is added to the DC current $I_{DC}$ so that the total tuning current applied to the DBR section switches between two values $I_{DC1}$ and $I_{DC2}$; e.g., between $I_{DC}$ and $I_{DC}+I_{SW}$ for the case where one of the values of the square wave is zero. Typically $I_{SW}$ is relatively small e.g., $10^{-3}$ to $10^{-4}$ of $I_{DC}$. The variations in the laser output power produced by the small, incremental changes in tuning current are detected by the reference detector 16.1 in the discriminator 16. Ultimately, these changes in current appear as variations in $V_{ref}$ the input to $\mu$P 18. A numerical derivative is calculated by the $\mu$P 18 and is used to stabilize the laser in the same fashion as the derivative obtained in an analog fashion using the phase locked loop of FIG. 1.

EXAMPLE

This example describes an optical transmitter of the type depicted in FIG. 1 in accordance with one embodiment of the invention. Various materials, dimensions and operating conditions are provided by way of illustration only and, unless otherwise expressly stated, are not intended to lathe scope of the invention.

The DBR laser comprised a three section, monolithically integrated device including a DBR section disposed between a gain section and a photodetector section. However, the latter was not utilized. Rather a discrete photodetector within the discriminator was used as the power monitor. In one design the gain section was 410 $\mu$m long; in another it was 820 $\mu$m long. In both cases the gain section included an MQW active region including a stack of six compressively strained InGaAsP (quaternary) quantum well layers grow,n on top of a 1.3 $\mu$m bandgap waveguide layers. The DBR section was 300 $\mu$m long and comprised a 1.42 $\mu$m bandgap, 2000 A thick quaternary layer grown during a separate growth step on top of the waveguide layers after the active region MQW layers had been removed by selective chemical etching.

The laser was mounted on top of a carrier (e.g., a silicon or ceramic substrate) and, in a fashion well known in the art, TEC 12.1 and sensor 12.2 were mounted under the carrier. Fiber was coupled through a well known lens arrangement to the front facet of the laser. Coupler 22 was a commercially available 5% tap that delivered a portion of the laser output power to a collimator built into the package wall of the discriminator 16. The light beam emerging from the collimator had a diameter of about 0.5 mm and divergence of about 0.25°. It was split into two beams by a sheet of InP that was AR coated on its output surface and tilted at an angle of about 10° with respect to the input beam axis. The portion of the beam reflected from the InP splitter was incident on photodetector 16.1 that served as a power monitor. The portion of the beam transmitted through the splitter was incident on a FP etalon tilted at an angle of about 5° with respect to the beam axis. Light emerging from the FP etalon was collected by photodetector 16.2. The photocurrent generated by the latter had impressed on it the transmission characteristics of the etalon. The power dependent ratio of the photocurrents of these two detectors served as the discriminant signal delivered to the $\mu$P 18 as $V_{FP}$ by transimpedance amplifier 24.

The discriminant signal was measured to be largely polarization independent. A sampling of about 500 polarization states distributed evenly over the Poincare sphere produced variation of the discriminant signal equivalent to a total peak-to-peak variation in wavelength of about 3 pm (picometers) at the steepest slope of the discriminator vs wavelength function The free spectral range (FSR) of the FP etalon was designed to match the tuning step size of the laser. Data of FIG. 3 showed a tuning step size and FSR each of 100 GHz. As will be discussed later, a combination of 100 GHz components can be used for a DWDM system with 50 GHz channel spacing.

The PSD 20 was a commercially available lock-in amplifier, and the $\mu$P 18 was a commercially available microprocessor. The dither source 28 imposed a 10 kHz, constant amplitude current (about 10 $\mu$A peak-to-peak), on the DC tuning current from source 26. The latter ranged from about 0.1 to 40 mA.

FIG. 3 shows the characteristics of the DBR laser a function of tuning current applied to the DBR section. Stepwise tuning to shorter wavelengths was observed with increasing tuning current. Midstep-to-midstep wavelength intervals of 0.8 nm (100 GHz) were observed, as determined by the optical length of the gain section (410 $\mu$m in this case). The SMSR was observed to peak at the center (average current) of each tuning step. Fiber-coupled output power from the gain section, shown in FIG. 5, showed characteristic rounded peaks roughly centered on each tuning step. Closer inspection showed that the peaks in power occurred at tuning currents slightly lower than that corresponding to the centers of each tuning step or to the peaks in the SMSR curve. We investigated DBR lasers with both 100 GHz tuning steps (FIG. 3) and 50 GHz tuning steps (not shown).

With the feedback loops open and the tuning and gain currents fixed variation in the DBR laser temperature was observed to cause the laser output to exhibit mode hopping. For a typical channel two mode hops were observed between and 10° and 40° C. To investigate the effectiveness of the mode-hop-suppression loop, the open to closed loop cases were compared for each tuning step as the laser temperature was gradually increased from 0° and 40° C. The results indicated that mode hopping was suppressed. No mode hops were observed for the approximately 20 tuning steps exhibited by this 50 GHz step-sized DBR laser over the entire temperature range. Tuning varied under closed loop conditions to maintain maximum SMSR as the temperature varied and the gain current remained fixed. The SMSR remained above about 30 dB over the entire range for all tuning steps, and was below about 35 dB only at higher temperatures at which the laser's threshold current was relatively high The observed rate of tuning with temperature was 0.095±0.003 nm/° C. for all steps, a value characteristic of 1.55 μm DFB lasers as well.

Figure 6:
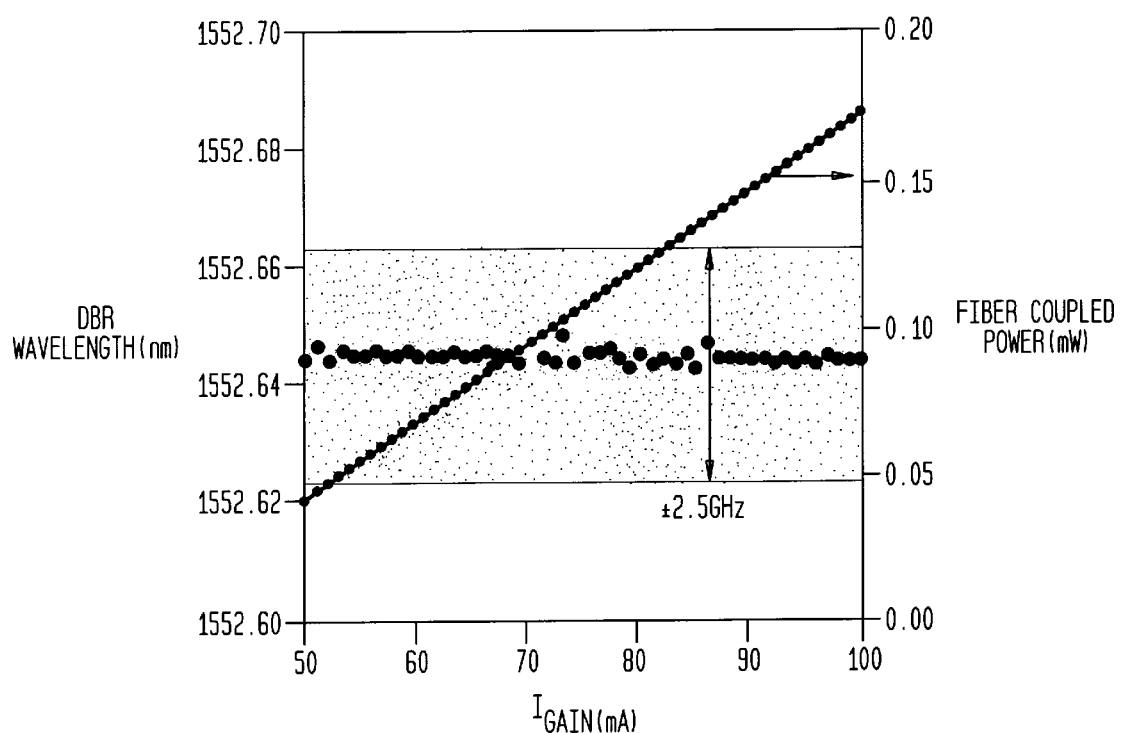
FIG. 6 shows graphs of the wavelength of the output of a DBR laser and the output power of the laser coupled into an optical fiber as a function of the gain current applied to the laser under closed loop wavelength and mode-hop control.

Dual loop control was also demonstrated by operating the transmitter with both the wavelength-stabilization loop and the mode-hop-suppression loop closed. The gain current was ramped from 50 mA (just below threshold at the highest tuning current) to 100 mA FIG. 6 shows the output power and wavelength for a given tuning step. Wavelength was observed to remain win about ±2 pm or ±0.25 GHz (wavelength resolution limited by instrumentation used) as the output power increased. Over the 50 mA range in gain current the fiber output power increased from about 0.05 to 0.17 mW, while the SMSR increased from about 35.5 to 41.5 dB. In practice, the third, power control feedback loop could be used to maintain constant the output power using the photodetector 16.1 in the discriminator 16. This third loop would operate together with the other two loops to maintain the power, wavelength and SMSR at a given point on FIG. 6.

What is claimed is:

1. A optical transmitter for use in a WDM system having a multiplicity of channels each operating at a different channel wavelength, said transmitter comprising a DBR semiconductor laser, the output of said laser having a center wavelength and at least one side mode, said center wavelength being responsive to tuning current applied to said laser, a feedback loop for controlling said center wavelength, characterized in that said transmitter also includes a memory in which are stored a non-zero value of a first derivative of the output power of said laser with respect to tuning current where a side mode suppression ratio (SMSR) is a maximum for each of said multiplicity of different channel wavelengths, and a controller for generating said first derivative and for comparing said generated and stored values, and, in response to said comparison, for delivering to said laser a level of tuning current that maximizes the SMSR for a particular channel wavelength.

2. The invention of claim 1 wherein said transmitter includes a microprocessor, said microprocessor including said memory and said controller.

3. The invention of claim 1 wherein said feedback loop includes a first feedback loop for stabilizing said center wavelength and a second feedback loop for preventing said center wavelength from hopping from one longitudinal mode to another.

4. The invention of claim 1 wherein said laser comprises a DBR section and a gain section arranged in tandem, said transmitter includes a current source for applying said tuning current to said DBR section, a phase sensitive detector (PSD), and a dither signal source coupled to said PSD and to said DBR section.

5. The invention of claim 4 further including a frequency discriminator responsive to an output of said laser, a microprocessor responsive to the outputs of said discriminator and said PSD for generating said first derivative.

6. The invention of claim 5 wherein said PSD is a lock-in amplifier that generates an in-phase lock-in signal, and said microprocessor compares the values of said in-phase lock-in signal to said stored values of said first derivative, thereby to deliver to said DBR section tuning current that maximizes said SMSR for each of said channel wavelengths.

7. The invention of claim 4 wherein said transmitter output is amplitude modulated, and the output of said dither source is scaled proportional to the tuning current so as to provide essentially constant modulation depth for each channel at each of the points of maximum SMSR.

8. The invention of claim 4 wherein said transmitter output is amplitude modulated, and the output of said dither source is essentially a constant voltage at each of the points of maximum SMSR.

9. The invention of claim 1 wherein said laser comprises a DBR section and a gain section arranged in tandem, said transmitter includes a current source for applying said tuning current to said DBR section, said controller includes a microprocessor that provides a relatively low amplitude square wave that is added to said tuning current to cause amplitude variations therein, and said transmitter includes means for detecting said variations and for supplying a corresponding signal to said microprocessor, said microprocessor calculating a numerical first derivative in response to said signal and comparing said calculated and stored first derivatives to one another, and based on said comparison adjusting the amplitude and duration of said square wave so as to deliver to said DBR section tuning current that maximizes said SMSR.

\* \* \* \* \*